United States Patent [19]

Black et al.

[11] Patent Number: 5,076,669
[45] Date of Patent: Dec. 31, 1991

[54] METHOD AND APPARATUS FOR SELECTIVELY BLOCKING LIGHT BEAMS OF DIFFERENT WAVELENGTHS WITH SINGLE COLOR-SENSITIVE FILTER

[75] Inventors: Michael Black, Foster City; Vladimir Kupershmidt, Fremont, both of Calif.

[73] Assignee: Reliant Laser Corp., Foster City, Calif.

[21] Appl. No.: 626,307

[22] Filed: Dec. 12, 1990

[51] Int. Cl.$^5$ .................. G02F 1/1335; G02F 1/23
[52] U.S. Cl. ................................ 359/63; 372/28; 359/66; 359/502
[58] Field of Search ............... 350/339 F, 352, 408, 350/390, 391; 372/28

[56] References Cited

U.S. PATENT DOCUMENTS

| | | | |
|---|---|---|---|
| 3,840,695 | 10/1974 | Fischer | 350/408 |
| 4,019,808 | 4/1977 | Scheffer | 350/408 |
| 4,071,912 | 2/1978 | Budmiger | 350/339 F |
| 4,155,122 | 5/1979 | Budmiger | 350/339 F |
| 4,510,225 | 4/1985 | Lipson | 351/49 |
| 4,595,262 | 6/1986 | Ogle | 350/404 |
| 4,703,522 | 11/1987 | Schurle et al. | 2/432 |
| 4,786,125 | 11/1988 | Magarinos et al. | 350/3.65 |
| 4,802,719 | 2/1989 | Magarinos et al. | 350/3.65 |
| 4,835,796 | 6/1984 | Wiedner | 2/431 |
| 4,946,259 | 8/1990 | Matino et al. | 350/339 F |
| 4,950,058 | 8/1990 | Diem et al. | 350/339 F |
| 4,953,953 | 9/1990 | Fergason | 350/408 |
| 4,989,954 | 2/1991 | Yokoyama et al. | 350/339 F |

OTHER PUBLICATIONS

*McGraw-Hill Dictionary of Scientific and Technical Terms*, D. Lapedes, editor, 1974, p. 803.
Walter Koechner, "Solid-State Laser Engineering," Springer-Verlag publishers, Berlin, 1988, p. 429.

*Primary Examiner*—Bruce Y. Arnold
*Assistant Examiner*—Martin Lerner
*Attorney, Agent, or Firm*—David Pressman

[57] ABSTRACT

A method and apparatus for selectively blocking light beams of different wavelengths with the use of a single color-sensitive filter by passing the beams through a multiple layer system consisting of an input polarization plate (12), an output polarization plate (14), a liquid crystal cell (18) sandwiched between voltage-controlled matrices (20a and 20b), and a mosaic color mask (34). The incident light is detected by a photoelectronic sensor (32) which sends voltage signals to respective pixels (22) which form the above-mentioned matrices. These signals selectively control the polarization states of the beams passed through the respective pixels. Depending on the polarization states of the beams, the output polarization plate can either block the light or pass it to a color mask (34). This mask consists of a periodical set of color cells, the amount and dimensions of which correspond to those of the pixels. As a result, the mask selectively filters the beam in accordance with its pattern.

7 Claims, 4 Drawing Sheets

METHOD AND APPARATUS FOR SELECTIVELY BLOCKING LIGHT BEAMS OF DIFFERENT WAVELENGTHS WITH SINGLE COLOR-SENSITIVE FILTER

BACKGROUND—FIELD OF THE INVENTION

The present invention relates to the field of electro-optics, particularly to color-sensitive light blocking filters. Such filters find application in laser surgery, photolithography, etc.

BACKGROUND—DESCRIPTION OF PRIOR ART

Prior to description of the invention and for better understanding of the terminology used in the specification, it will be helpful to explain the structure of typical elements of a blocking filter utilizing polarizing optics.

It is known that if a light is passed through a polarization element, e.g., a polarization plate, the direction of the electrical field of the light will become oriented parallel to the optical axis of the polarization plate. In other words, the light becomes polarized. If a second polarization plate is installed parallel to the first plate and on the optical path of the polarized light, the polarized light will pass through the second plate only if the optical axis of this second plate is parallel to that of the first one. If the optical axis of the second polarization plate is turned by 90° with respect to the optical axis of the first plate, the polarized light will be blocked by the second polarization plate.

The intensity of the light passed through both plates can be varied between full transmission and full blocking by changing the relative angle between the optical axes of both plates. Parallel polarization plates having mutually perpendicular axes are known as crossed polarizers.

Those crossed polarizers which have their axis adjustable with respect to each other are known as tunable polarizers. Tunable polarizers find wide application in electro-optics, e.g., in a voltage-controlled liquid crystal retarder which is a device consisting of an input polarizer, an alignment plate, a liquid crystal, and an output polarizer. See, e.g., "Properties of Tunable Nematic Liquid Crystal Retarders" by Scott E. Gilman, et al., (Meadowlark Optics, Longmont, Colo.), and Narendra K. Shankar (Cornell University, School of Electrical Engineering, Ithaca, New York), 1990. All four elements of the system are arranged sequentially on the same optical path. The input polarizer polarizes the incident light. The alignment plate and liquid crystal are used as an integral unit and rotate the optical axis of the polarized light by means of a voltage applied to the liquid crystal, while the output polarizer passes the light treated by the system.

However, this tunable retarder is applicable for blocking a light of a given wavelength and cannot be used for selectively blocking lights of different wavelengths. For example, if a light is a mixture of green and red components, the aforementioned tunable retarder cannot block only green and pass only red light, or vice-versa.

It is not unusual, however, to provide a system utilizing a number of light sources of different power for light of different wavelengths (colors). Such systems find application in medicine, e.g., as safety filters in laser surgery where one laser beam is used as a low-power beam of one color (an alignment beam), while the other laser beam is used as a high-power or operation beam. Normally, both such beams coincide and propagate along the same optical path. Prior to a surgical operation, a surgeon uses the color alignment beam, which is visible, for alignment on the area or target to be treated. Since this beam is of a low power, it cannot damage the target. Once the alignment is done, the surgeon switches the system over to the power beam which performs the operation on the target exactly at the point where the low-power beam has been directed In other words, the surgeon, although using the power beam "blindly⇌ is aware of that the power beam has been aimed at the target. It is understood that the surgeon never sees laser beams directly, but sees only reflected lights through a transparent protective device.

In many cases, however, several power laser beams of different wavelengths must be used sequentially for the same surgical operation. This may be required when the operation involves different treatment procedures, such as surface treatment and penetration into the tissue to a predetermined depth. The same situation may occur in photolithography when several laser sources with different wavelengths are used in the same operating room. Such situations require protection of people from exposure to all reflected laser beams at any time. Therefore an individual laser blocking filter would be required for each power beam. It is also understood that only one filter can be used at any given time. Therefore the existing systems used for selective filtering are large in size, complicated in construction, expensive to manufacture, and difficult to use.

The situation becomes even more complicated when laser sources operate in a pulse mode, since the filters must be switched with the same frequency as pulses. At the present time, however, devices used for switching the laser blocking filters are mechanical shutters. Such shutters are produced, e.g., by Coherent Medical Lasers Co., Palo Alto, California. The main disadvantages of such shutters are noise created during their operation, low frequency of switching, and inability to block lights of more than two different wavelengths.

OBJECTS AND ADVANTAGES OF THE INVENTION

It is therefore an object of the invention to eliminate the above disadvantages and to provide a method and apparatus for selectively blocking laser scattered light beams of different wavelengths. Another object is to provide such an apparatus of the aforementioned type which is small is size, simple in construction, inexpensive to manufacture, and easy to use. Still another object is to provide a method and apparatus which allow simultaneous use of several monochromatic light sources of different wavelengths with reliable selective blocking of required light beams. A further object is to provide an apparatus of the aforementioned type which is noiseless in operation, can operate in a high-frequency mode, and is suitable for a wide range of wavelength bands. A still further object is to provide an apparatus of this type which requires use of a single color-sensitive filter only. Other advantages and features of the invention will become apparent from a consideration of the ensuing description and drawings.

REFERENCE NUMERALS USED IN THE DRAWINGS AND DESCRIPTION

Figure 1:
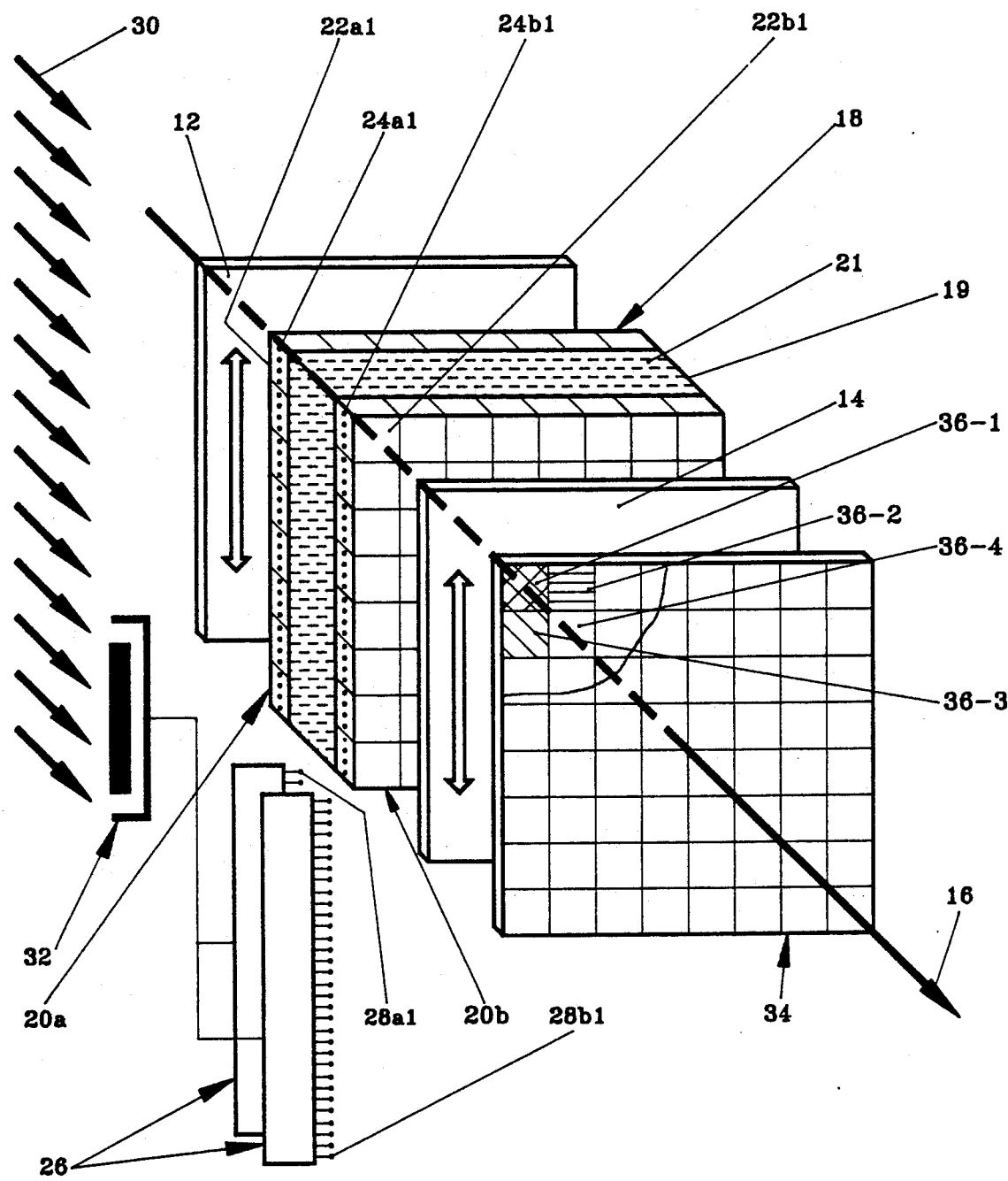
FIG. 1 is a perspective schematic view of an apparatus of the invention for selectively blocking laser scattered light beams of different wavelengths with the use of a single color-sensitive filter.

12 - input polarization plate
14 - output polarization plate
16 - common optical path
18 - liquid crystal cell
19 - space between plates
20a, 20b - voltage-controlled matrices
21 - liquid crystal
22a1, 22b1, ... 22an, 22bn - pixels
24a1, 24b1 ... 24an, 24bn - terminal leads
26 - signal processor
28a1, 28b1 ... 28an, 28bn - terminals
30 - incident light
32 - photoelectronic sensor
34 - color mask
36-1 - orange color cell
36-2 - blue color cell
36-3 - green color cell
36-4 - colorless cell
G - high-power green light
R - low-power red light

FIG. 1—DETAILED DESCRIPTION OF THE APPARATUS OF THE INVENTION

The apparatus for carrying out the method of the invention is shown in FIG. 1 which is a perspective schematic view of a system for selectively blocking laser scattered light beams of different wavelengths with the use of a single color-sensitive filter.

As shown in FIG. 1, the apparatus consists of an input polarizing plate 12 and an output polarizing plate 14. The optical axes of both plates are parallel. In FIG. 1, as well as in FIGS. 4, and 5, which will be referred to later, the directions of polarization are shown by double-sided arrows.

Both plates are located on a common optical path 16. In the illustrated example, plate 12 polarizes an incident light beam (along path 16) in the vertical (Y) direction, while plate 14 also passes this light because its optical axis is parallel to that of plate 12. The optical axes of both polarization plates are never changed.

Arranged between polarizing plates 12 and 14 is a liquid crystal cell 18 which is sandwiched between a pair of two-dimensional voltage-controlled active matrices 20a and 20b.

Liquid crystal cell 18 consists of two precision parallel transparent plates (not shown). The facing surfaces of the glass plates are lined with a polymer which is called the alignment layer (not shown). A space 19 between the plates is filled with liquid crystals 21 which can be mechanically aligned to form a uniaxial layer and which can be electrically rearranged (Photonics Spectra, April 1990, p. 82) to change the polarization direction.

Each of two-dimensional active matrices 20a and 20b is made of an electrically conductive transparent material and is divided into individual isolated pixels (microscopic cells) 22a1, 22a2 ... 22an, 22b1, 22b2, ... 22bn. These pixels can be individually addressed and controlled through terminal leads 24a1, 24b1, 24a2, 24b2, 24an ... 24bn, where terminals designated by "a" relate to active matrix 20a and terminals designated by "b" relate to active matrix 20b.

Each pixel is activated by a voltage supplied to it via respective terminal leads. For example, pixel 22a1 is activated through terminal leads 24a1 and pixel 22b1 is activated through terminal lead 24b1. The pixels are activated in pairs, i.e., two pixels located opposite each other and symmetrically with respect to liquid crystal cell 18 are activated simultaneously through respective terminal leads.

When no voltage is applied to a given pixel, a direction of polarization of light passing through this pixel is turned by 90° with respect to the direction of polarization provided by input plate 12. Therefore, this light will be blocked by output polarization plate 14. As a result, no beam will pass through this given pixel. This ensures an additional safety feature, since in case of an unexpected failure of a pixel (e.g., because of shortcircuiting or breakage of electrical contact, etc. ), the viewer's eyes will still be protected from an exposure to the power reflected beam.

When a voltage exceeding a threshold ensuring switching of the direction of polarization by this pixel is applied to the latter, the pixel will pass the polarized incident beam and will not change the direction of its polarization. Such a beam will pass through output plate 14 and will reach a respective cell of color mask which will be described alter.

For simplicity of explanation, the remaining description will refer to a single pixel, e.g., 22 instead of 22a and 22b, keeping in mind that in reality this refers to a pair of oppositely arranged pixels.

Each terminal lead is connected to a respective terminal on a signal processor and power supply unit 26 (hereinafter referred to as "signal processor 26"). For example, terminal lead 24a1 is connected to terminal 28a1, terminal lead 24a2 is connected to terminal 28a2, etc. In other words, each pixel can be controlled and directly addressed from signal processor 26 via respective terminal leads.

Signal processor 26 is a voltage generating unit capable of operating in a continuous or pulse mode, depending on the wavelengths of incident light 30. An example of such a signal processor is described in Catalog No. 1 of Meadowlark Optics, 1990, Colorado.

On the side opposite to signal processor 26 there is a photoelectronic sensor 32, e.g., a photodiode, which is located in front of the facing surface of input polarizer 12. In other words, this sensor detects wavelengths of an incident light 30 and selectively controls the operation of active matrices 20a and 20b via signal processor 26. Thus sensor 32, signal processor 26, and terminal leads 24a1, 24b1 ... form a control circuit.

The number of terminal leads is equal to the amount of pixels and terminals. However, in order to simplify the drawing, the number of terminal leads and the number of terminals shown in FIGS. 3, 4, and 5 do not coincide with each other and with the amount of pixels.

The last element of the apparatus of FIG. 1 is color mask 34. Mask 34 comprises a plate in a plane parallel to liquid crystal cell 18 and consists of individual color cells 36-1, 36-2, ... 36-$n$. Each color cell 36-1, 36-2, ... 36-$n$ has the same dimensions as respective pixel pair $22a1$ and $22b1$, $22a2$ and $22b2$, ... $22an$ and $22bn$. In other words, each color cell is an exact projection of a respective pixel pair onto color mask 34.

Figure 2:
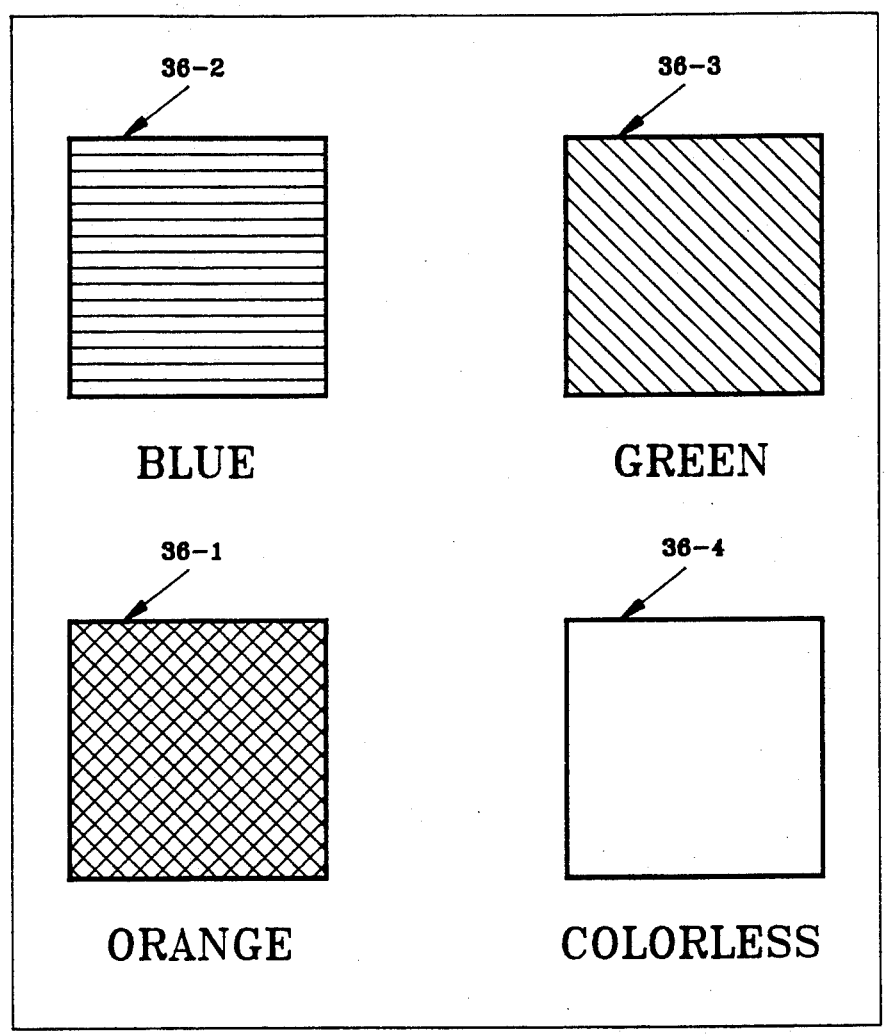
FIG. 2 designates various colors in the system of FIG. 1.

Mask 34 is a mosaic of periodically arranged cells of different colors. For example, color cell 36-1 is orange, color cell 36-2 is blue, color cell 36-3 is green, and cell 36-4 is colorless (FIG. 1). In view of the fact that the drawings are printed in black-and-white, the different colors are designated by the hatchings shown in FIG. 2. For the sake of simplicity, only four different colors are shown. However, that mask may have cells of less than four or more than four colors. Also for simplicity, the operation of the mask will be illustrated with reference only to a group of adjacent cells which will be shown in respective color code, while the color of the remaining cells will not be shown.

It should be noted that individual pixels $22a1$, $22b1$, $22a2$, $22b2$ ..., and thus color cells 36-1, 36-2, ... have small dimensions. E.g., with a range of 20 to 100 cells per centimeter, when mask 34 passes through its respective cells the light of a predetermined color, a human eye can see the entire mask in a continuous monochromatic color without visible degradation into cells. This principle is used in printing for reproduction of halftone color images, which in fact consist of a plurality of color dots having different density distribution.

Each color cell is made of a material selectively transparent to a light of a given wavelengths. It can be a color glass, color polymer, etc. In other words, each color cell is a color filter, preferably a narrow-band color filter Technically such a mosaic-type mask can be prepared by merely assembling the entire unit from elementary color cells, or each cell can be prepared photolithographically by selectively exposing, etching, and processing a multiple-layer plate.

Other methods are possible and the manufacture of the color mask is beyond the scope of the present invention, provided it satisfies the requirements of the present filter.

Figure 3:
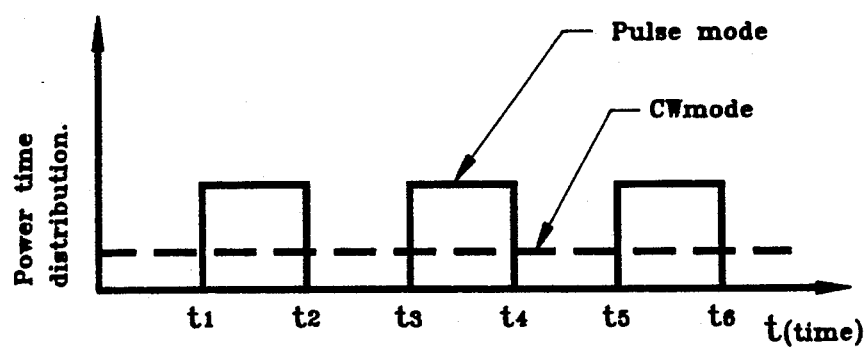
FIG. 3 is a power time distribution diagram illustrating operation of a system containing two laser sources working in pulse and continuous modes, respectively.
Figure 4:
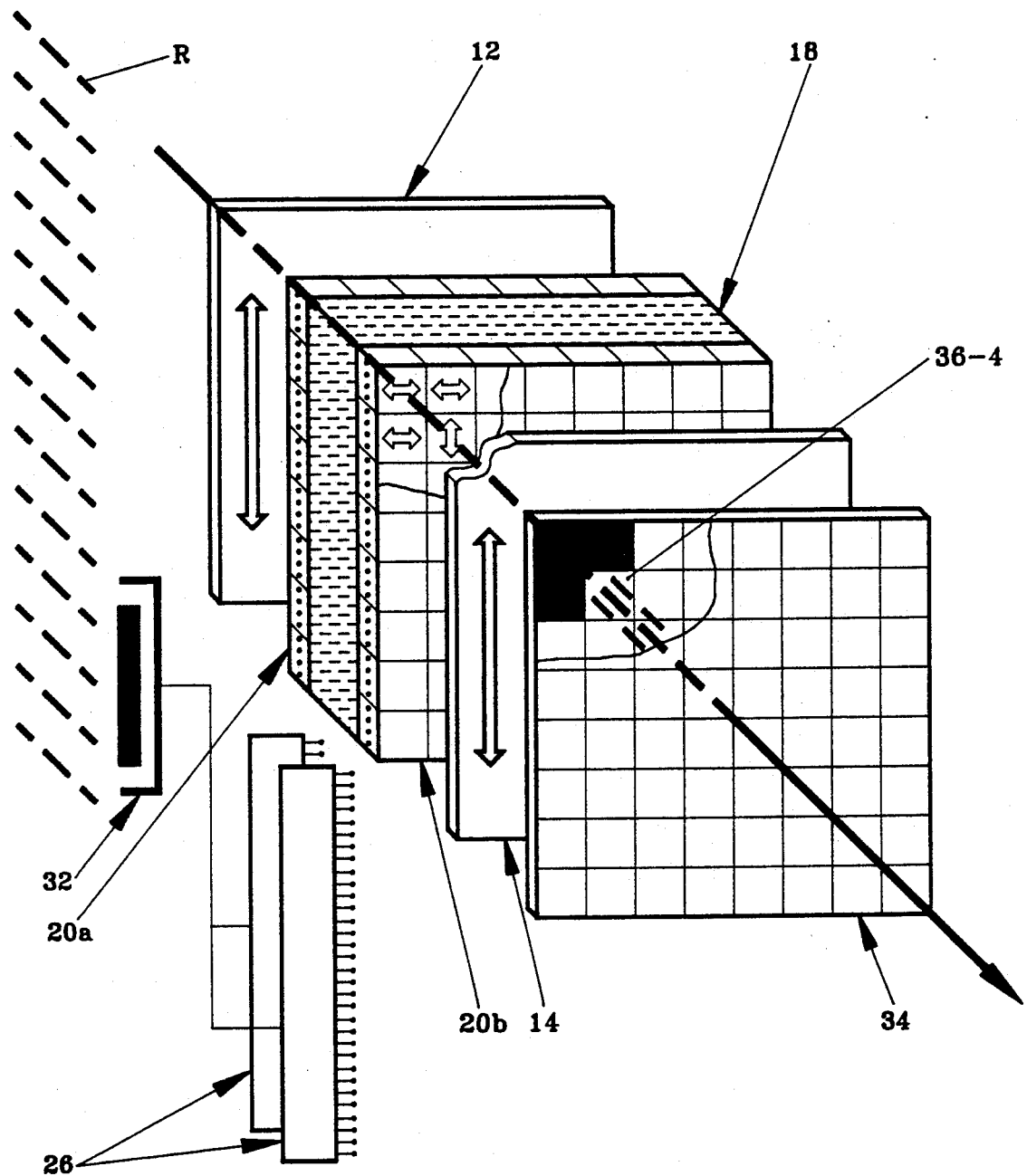
FIG. 4 is a the same view as in FIG. 1 illustrating the transmission of a red aiming beam in predetermined pulse intervals.
Figure 5:
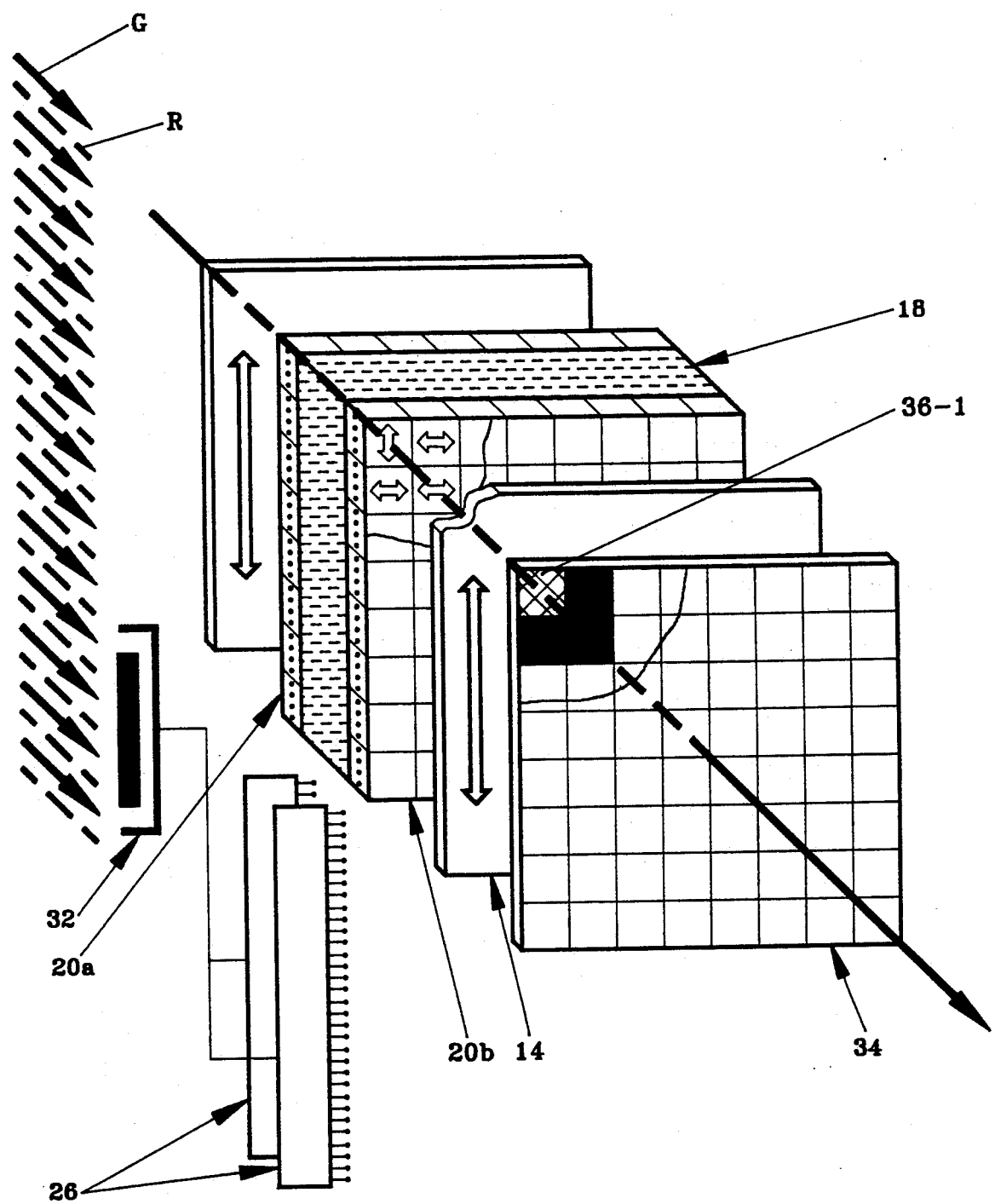
FIG. 5 is the same view as in FIG. 1 illustrating the transmission of a red aiming beam and filtering a green power beam in predetermined pulse intervals.

FIGS. 3, 4, and 5—OPERATION

The operation of apparatus of FIG. 1 will now be described with reference to a specific example of a safety filter illustrated in FIGS. 3, 4, and 5, in which two laser sources (not shown) are used. Such a filter may find application in laser eye surgery. A surgeon must be protected from a reflected power beam and should be able to continuously observe the location of an aiming low-power beam. Therefore, one laser source generates a high-power beam, e.g., in pulse mode. It can be, e.g., a green argon laser of a $0.514\mu$ wavelength. Another laser source generates a helium-neon of $\lambda = 0.632\mu$ (hereinafter referred to as He-Ne) laser source. In the present context we deal with a reflected laser beam only.

A power time distribution diagram illustrating operation of the apparatus of FIG. 1 containing two laser sources working in the pulse and continuous modes, respectively, is shown in FIG. 3. In this diagram, high square pulses correspond to square waveforms of green high-power light, while a continuous broken line corresponds to the red low-power light. In this diagram, points $t_1$, $t_3$, $t_5$... show rise times and points $t_2$, $t_4$, $t_6$, etc. show fall times of impulses of the high-power light. In FIGS. 4 and 5, which illustrate two different time intervals of operation of the apparatus, high-power beam green light is designated by a continuous arrow G, while the low-power red light is shown by broken lines R.

It is known that an orange filter does not pass green light. Since in our case, the surgeon must be protected from green power light G, orange filter must be switched into operation only during time intervals between points $t_1$ and $t_2$, $t_3$ and $t_4$, ... In spite of the fact power green light G is blocked, the surgeon will observe the position of this light through a fluorescent reaction of tissue treated with this beam.

Now the operation of the apparatus will be considered with reference to FIG. 4 for time intervals between points 0 and $t_1$, $t_2$ and $t3_3$, ... (FIG. 3), i.e., for the time intervals when the power pulses are absent. Such a mode corresponds to a period of operation when the surgeon aims the alignment beam at the target location on the tissue, so that reflected red beam R must pass through the apparatus. To achieve this goal, all color cells, except for colorless cells 36-4 must be blocked.

During this stage of the operation, continuous red light R passes through input polarization plate 12 and is converted into polarized light which falls onto front active matrix 20$b$. Prior to reaching input plate 12, polarized light is detected by photoelectronic sensor 32 which measures its wavelengths (wavelength and power) required for identification of this light. Via the control circuit formed by signal processor 26, terminals 28, and terminal leads 24, voltage signals generated by signal processor 26 will be supplied to only to selective pixels $22a4$, and $22b$-4

When a voltage is applied to pixels $22a4$ and $22b$-4, molecules of the liquid crystal located between these particular pixels will be rearranged in such a manner that the direction of polarization of light passing through this pixel will remain unchanged As a result, the pixels will pass the polarized incident beam to output polarization plate 14. As the latter has the same polarization direction as input polarization plate 12 and light, the latter will not be blocked by plate 14 and reach a respective colorless cell 36-4 and then pass through this cell unobstructed.

In time intervals between points $t_1$ and $t_2$, $t_3$ and $t_4$, ..., the system should pass both beams, i.e., high-power green beam G and low-power red beam R (FIG. 5). As has been explained above, such a situation requires the use of an orange filter, which in the illustrated is an orange cell 36-1 of color mask 34.

When a voltage is applied to pixels $22al$ and $22b$-1, molecules of the liquid crystal located between these particular pixels will be rearranged in such a manner that the direction of polarization of both beams passing through this pixel will remain unchanged. As a result, the pixels will pass the polarized incident beams to output polarization plate 14. As the latter has the same polarization direction as input plate 12 and passes the beam, the latter will not be blocked by plate 14 and will reach a respective orange cell 36-1. Since this cell is a filter for green light G, it will not pass green light G, so that the surgeon will see only low-power red light R and the fluorescent tissue reaction in orange.

At the present time, all materials and optical elements required for reducing the invention to practice are available on the market and produced commercially. For example, thin-film linear polarizers and liquid crystal cells are produced by Medowlark Optics, supra. The polarizers are manufactured with diameters in the range of 3.17 mm to 50.8 mm, and with thicknesses within the range of 2.61 mm to 12.77 mm. The same products are manufactured many other optical companies.

Thin-film indium-tin oxide, which is the basic material of active matrix 20, is produced, e.g., by Tosoh SMD Co., Japan. The company produces one-piece targets from 50.8 mm to 304.8 mm in diameter up to 127×254 mm planar with target sizes available in multi-piece construction.

Some materials mentioned above are used in the latest technology by a number of companies (Hitachi America Ltd., Illinois, Optical Imaging Systems Inc., Michigan, and others) for the production of active-matrix liquid-crystal displays (AMLCD), e.g., for color TV or color projection screens.

SUMMARY, RAMIFICATIONS, SCOPE

Thus, it has been shown that the filter provides a method and an apparatus for selectively blocking laser scattered light beams of different wavelengths with the use of a single color-sensitive filter. The apparatus is small in size, simple in construction, inexpensive to manufacture, and easy to use. It allows simultaneous use of several monochromatic light sources of different wavelengths with reliable selective blocking of required light beams As compared to electromechanical shutter-type apparatus, the apparatus is noiseless in operation and can operate in a high-frequency mode and in a wide range of wavelength bands.

Although the filter has been shown and described in the form of one specific embodiment, this embodiment, its parts, materials, and configurations have been given only as examples, and that many other modifications of active matrices 20, liquid crystal cell 18, and color mask 34 are possible For example, the illustrated embodiment relates to a specific power time distribution of two beams, one of which was a high-power green Ar light operating in a pulse mode, while the other one was a low-power red He-Ne light operating in a continuous mode. However, that more than two light beams can be selectively processed by the apparatus A great variety of modes of operations can be utilized within the scope of the invention. For example, in the illustrated embodiment, both lights can operate in a pulse mode or in a continuous mode. The color mask may contain cells of less or more than four colors and the mosaic can be composed of greater or smaller number of color cells than that shown in FIGS. 3, 4, and 5.

In the illustrated embodiment, the apparatus is designed for processing an incident unpolarized light. However, the incident light can be polarized and in this case polarization plates 12 and 14 should be turned so that directions of optical axes of these plates coincide with the direction of polarization of the incident light.

Color mask 34 can be installed in front of output plate 14 rather than after the latter, as shown in the drawings.

Although the filter has been described with reference to a laser beam source, it is equally applicable to a monochromatic light beam sources.

The method and apparatus of the invention can be used not only in medicine, but in photolithography, or other related fields.

Therefore, the scope of the invention should be determined, not by the example given, but by the appended claims an their legal equivalents.

What we claim is:

1. A method for selectively blocking either of at least two scatter laser beams, which have different wavelengths and time operation modes, with the use of a single color-sensitive filter, comprising the steps of:
   (a) providing a system composed of the following elements:
      (1) an input polarization element, a liquid crystal cell sandwiched between a pair of voltage-controlled matrices, an output polarization element, and a single color-sensitive filter,
      (2) said input polarization element and said liquid crystal cell being sandwiched between said voltage-controlled matrices, said output polarization element and said filter being arranged sequentially in the direction of scattering of said beams on a common optical path, and
      (3) means for sensing at least two characteristic of said beams, said means being positioned in front of said input polarization element on said optical path, said means controlling said voltage-controlled matrices;
   (b) passing said beams through said system in a direction from said input element to said output element;
   (c) detecting said at least two characteristic of said beams with said means for sensing;
   (d) selectively controlling said voltage-controlled matrices in accordance with the detected characteristics of said beams, so that molecules of said liquid crystal cell are selectively reoriented in accordance with the voltage applied to said matrices and said beams change th e direction of their polarization acquired after passing through said input polarization element;
   (e) controlling said beams which have passed through said liquid crystal cell by passing them through said output polarization element; and
   (f) selectively filtering the beams which are transmitted through said output polarization element by passing them through said filter,
      said single color-sensitive filter comprising a mosaic color mask composed of a plurality of periodically arranged color cells, so that said beams which have passed through said output polarization element are selectively filtered in accordance with their color, each of said-voltage controlled matrices being made of an electrically conductive transparent material which is divided into a plurality of individual isolated pixels;
      said means for sensing a characteristic of said beams comprising a sensor capable of detecting said characteristics of said beams in front of said input polarization element, a power supply unit with a signal processor which generates voltage signals and has a plurality of terminals, each of which corresponds to a respective pixel of said plurality of terminals, so that said voltage signals are supplied to said respective pixels through said terminals in accordance with said detected characteristics.

2. The method of claim 1 wherein at least one of said beams is a high-power beam and the other said beams is a low-power beam.

3. The method of claim 2 wherein said means for sensing said characteristics of said beams is arranged to sense at least wavelengths and pulse repetition rates.

4. The method of claim 3 wherein the number of said beam is two, said high-power beam is a high-power reflected laser beam, and said low-power beam is a low-power reflected laser beam.

5. An apparatus for selectively blocking either of two scattered laser beams, which have different wavelengths and time operation modes, with the use of a single color-sensitive filter, comprising:
    (a) an input polarization element, a liquid crystal cell sandwiched between a pair of voltage-controlled matrices, an output polarization element, and a single color-sensitive filter,
    (b) said input polarization element and said liquid crystal cell sandwiched between said voltage-controlled matrices, said output polarization element and said filter being arranged sequentially in the direction of scattering of said beams on a common optical path,
    (c) means for sensing wavelengths and pulse repetition rates of said beams, said means being positioned in front of said input polarization element on said optical path, said means selectively controlling said voltage-controlled matrices,
    (d) said single color-sensitive filter comprising a mosaic color mask composed of a plurality of periodically arranged color cells, so that said beams which have passed through said output polarization element are selectively filtered in accordance with their colors,
    (e) each of said voltage-controlled matrices being made of an electrically conductive transparent material and divided into a plurality of individual isolated pixels, said means for sensing said wavelengths and pulse repetition rates of said beams comprising a sensor capable of detecting said wavelengths and pulse repetition rates of said beams in front of said input polarization element,
    (f) a power supply unit with a signal processor which generates voltage signals and has a plurality of terminals, each of which corresponds to a respective pixel of said plurality, so that said voltage signals are supplied to said respective pixels through said terminals in accordance with said wavelengths and pulse repetition rates, one of said beams being a high-power beam the other of said beams 6. An apparatus for selectively blocking, with the use of a single color-sensitive filter, an aiming laser beam which is to be viewed by a surgeon, and a treatment power laser beam aimed in accordance with the position of said aiming beam, comprising:
    (a) an input polarization element, a pair of voltage-controlled matrices, a liquid crystal cell sandwiched between said pair of voltage-controlled matrices, an output polarization element, and a single color-sensitive filter,
    (b) said input polarization element, said liquid crystal cell sandwiched between said voltage-controlled matrices, said output polarization element, and said single color-sensitive filter being arranged sequentially in the direction of scattering of said beams on a common optical path, and
    (c) means for sensing the wavelengths of both of said beams and the pulse repetition rate of said treatment power laser beam, said means being positioned in front of said input polarization element on said optical path and arranged to selectively control said voltage-controlled matrices, said single color-sensitive filter comprising a mosaic color mask composed of a plurality of periodically arranged color cells, so that said laser beams which have passed through said output polarization element are selectively filtered in accordance with their color.

7. The apparatus of claim 6 wherein each of said voltage-controlled matrices is made of an electrically conductive transparent material and is divided into a plurality of individual isolated pixels, said means for sensing said wavelengths and pulse repetition rates comprising a sensor capable of detecting said wavelengths and pulse repetition rates in front of said input polarization element, a power supply unit with a signal processor which generates voltage signals and has a plurality of terminals, each of which corresponds to a respective pixel of said plurality, so that said voltage signals are supplied to said respective pixels through said terminals in accordance with said detected wavelengths and said pulse repetition rates.

* * * * *

UNITED STATES PATENT AND TRADEMARK OFFICE
CERTIFICATE OF CORRECTION

PATENT NO. : 5,076,669

DATED : December 31, 1991

INVENTOR(S) : M. Black, et al

It is certified that error appears in the above-identified patent and that said Letters Patent is hereby corrected as shown below:

Col. 2, l. 12, change the double arrows to —"—.

Col. 5, l. 36, after "filter" insert —.—.

Col. 7, l. 28, after "beams" insert —.—.

Col. 7, l. 43, after "apparatus" insert —.—.

Col. 8, l. 32, change "th e" to —the—.

Col. 10, l. 2, after "beams" insert —being a low-power beam.—

Signed and Sealed this

Twenty-ninth Day of June, 1993

Attest:

MICHAEL K. KIRK

Attesting Officer

Acting Commissioner of Patents and Trademarks